United States Patent
Miyake et al.

(10) Patent No.: US 6,657,137 B2
(45) Date of Patent: Dec. 2, 2003

(54) CONNECTION STRUCTURE AND CONNECTION METHOD OF FOR CONNECTING TWO CIRCUIT BOARDS

(75) Inventors: Toshihiro Miyake, Inuyama (JP); Kazuya Sanada, Kariya (JP)

(73) Assignee: Denso Corporation, Kariya (JP)

( * ) Notice: Subject to any disclaimer, the term of this patent is extended or adjusted under 35 U.S.C. 154(b) by 35 days.

(21) Appl. No.: 09/904,900

(22) Filed: Jul. 16, 2001

(65) Prior Publication Data

US 2002/0022385 A1 Feb. 21, 2002

(30) Foreign Application Priority Data

Jul. 27, 2000 (JP) ........................................ 2000-231429

(51) Int. Cl.[7] .............................................. H01R 12/00
(52) U.S. Cl. ........................ 174/521; 174/250; 174/261; 361/748; 361/760; 361/767
(58) Field of Search ................. 174/52.1, 261, 174/262, 250, 68.1; 361/748, 751, 760, 767, 823; 257/774, 776

(56) References Cited

U.S. PATENT DOCUMENTS

| | | | | |
|---|---|---|---|---|
| 5,118,386 A | * | 6/1992 | Kataoka et al. | 174/254 |
| 5,428,190 A | * | 6/1995 | Stopperan | 174/261 |
| 5,954,262 A | * | 9/1999 | Inoue et al. | 228/245 |
| 6,107,685 A | * | 8/2000 | Nishiyama | 257/737 |

* cited by examiner

Primary Examiner—Dean A. Reichard
Assistant Examiner—W. David Walkenhorst
(74) Attorney, Agent, or Firm—Posz & Bethards, PLC

(57) ABSTRACT

In a connection structure for both first and second circuit boards, plural first terminals are arranged on the first circuit board in an arrangement direction, and plural second terminal are arranged on the second circuit board in the arrangement direction. The first and second circuit boards are disposed so that the first connection terminals and the second connection terminals are overlapped to each other, and the first connection terminals and the second connection terminals are connected by using an electrical conductive material. In the connection structure, an arrangement pitch of the first and second connection terminals is made smaller at an endmost portion or/and in vicinity of the endmost portion in the arrangement direction.

26 Claims, 1 Drawing Sheet

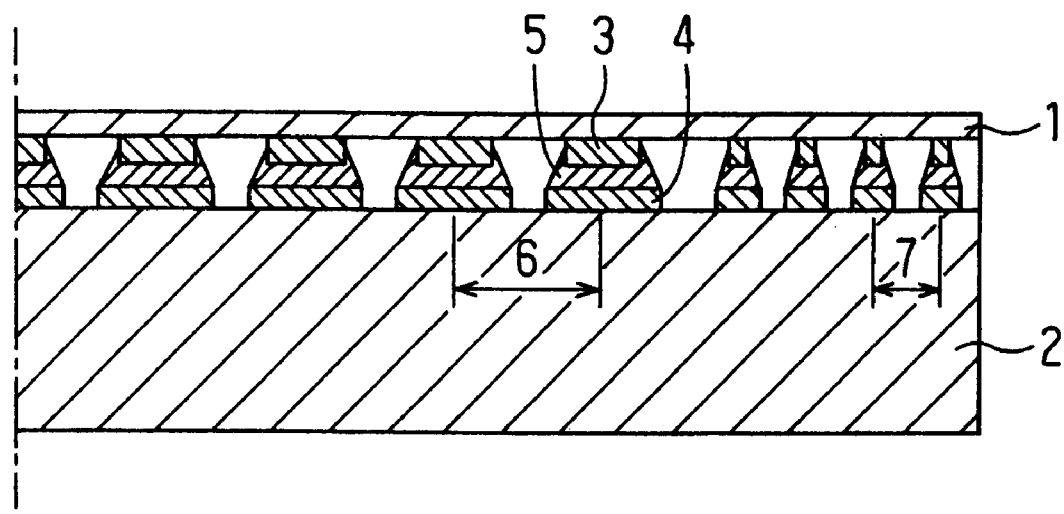

CONNECTION STRUCTURE AND CONNECTION METHOD OF FOR CONNECTING TWO CIRCUIT BOARDS

CROSS-REFERENCE TO RELATED APPLICATION

This application is related to Japanese Patent Application No. 2000-231429 filed on Jul. 27, 2000, the contents of which are hereby incorporated by reference.

BACKGROUND OF THE INVENTION

1. Field of the Invention

The present invention relates to a connection structure between both circuit boards and a connection method for connecting both the circuit boards.

2. Description of Related Art

For connecting both circuit boards, there is a tendency to adopt a connection structure in which plural connection terminals are arranged on each of the circuit boards, and the circuit boards are disposed so that these connection terminals are overlapped with each other to be connected by soldering or the like. When an electronic product package is used in practice, the whole circuit board is sometimes exposed to low-temperature and high-temperature environment (for example, −40° C. to 150° C.) in repetition. In this case, the temperature of the terminal connection portion is changed between a low temperature and a high temperature, thereby causing heat strain at the terminal connection portion. Due to occurrence of this heat strain in repetition in the terminal connection portion, the terminal connection portion may be ruptured.

When a large current is supplied to the connection portion, it is advantageous to enlarge each connection terminal as much as possible. However, when the size of the connection terminal is made larger, an arrangement pitch of the connection terminals becomes wider. In this case, the above-described heat strain further becomes larger, and a period from the occurrence of fatigue to the rupture becomes shorter.

SUMMARY OF THE INVENTION

In view of the foregoing problems, it is an object of the present invention to provide a connection structure of both first and second circuit boards, which reduces heat strain in the circuit boards, and improves fatigue life of a connection portion of both the circuit boards.

It is an another object of the present invention to provide a connection method for connecting both first and second circuit boards while reducing the heat strain in the circuit boards and improving the fatigue life of the connection portion.

According to the present invention, in a connection structure for both first and second circuit boards, a plurality of first connection terminals are arranged on the first circuit board in an arrangement direction, a plurality of second connection terminals are arranged on the second circuit board in the arrangement direction, and an electrical conductive material is disposed between the first and second connection terminals. The first connection terminals and the second connection terminals are disposed opposite to each other, to be overlapped with each other. Further, the first and second circuit boards are disposed to be connected to each other by connecting the first and second connection terminals using the electrical conductive material, the first and second connection terminals are arranged to have a first arrangement pitch in a predetermined range from a center in the arrangement direction and to have a second arrangement pitch at an endmost portion or/and in a vicinity of the endmost portion, and the second arrangement pitch is smaller than the first arrangement pitch. Accordingly, in the connection structure, heat strain applied to the connection terminals at the endmost portion and in the vicinity of the endmost portion can be made smaller, and the fatigue life in the connection portion of both the first and second circuit boards can be improved.

According to the present invention, a connection method for connecting first and second circuit boards includes, forming a plurality of first connection terminals to be arranged on the first circuit board in an arrangement direction, forming a plurality of second connection terminals to be arranged on the second circuit board in the arrangement direction, disposing the first connection terminals and the second connection terminals opposite to each other to be overlapped to each other, and connecting the first connection terminals and the second connection terminals by using an electrical conductive material. In the connection method, the first and second connection terminals are arranged in the first and second circuit boards to have a first arrangement pitch in a predetermined range from a center in the arrangement direction and to have a second arrangement pitch at an endmost portion or/and in a vicinity of the endmost portion, and the second arrangement pitch is smaller than the first arrangement pitch. Accordingly, in this connection method, the first and second circuit boards can be readily connected while reducing the heat strain in the circuit boards and improving the fatigue life of the connection portion.

BRIEF DESCRIPTION OF THE DRAWING

Additional objects and advantages of the present invention will be more readily apparent from the following detailed description of a preferred embodiment when taken together with the accompanying drawing, in which:

The FIGURE is a partial diagrammatic cross-sectional view illustrating a connection structure of two circuit boards according to a preferred embodiment of the present invention.

DETAILED DESCRIPTION OF THE PRESENTLY PREFERRED EMBODIMENT

A preferred embodiment of the present invention will be described hereinafter with reference to the FIGURE.

In a connection structure for connecting circuit boards according the present invention, a plurality of first connection terminals 3 arranged on a first circuit board 1 and a plurality of second connection terminals 4 arranged on a second circuit board 2 are disposed to be overlapped with each other, and are connected by using an electrical conductive material 5. As an example of the circuit board 1, 2, a printed circuit board can be used. For example, the first circuit board 1 is a flexible printed circuit board, and the second circuit board 2 is a rigid printed circuit board. As a material of an insulating substrate of the flexible printed circuit board, polyimide (PI), polyether ether ketone (PEEK) or polyether imide (PEI) can be used, for example. Preferably, a material containing 65 to 35 wt. % of PEEK and 35 to 65 wt. % of PEI or polyimide (PI) is used.

On these two printed circuit boards 1, 2, a plurality of conductor patterns are formed, respectively, so as to correspond to each other. At each end portion of the conductor patterns, a land is formed as the connection terminals 3, 4. These conductor patterns are usually made of copper. The conductor patterns are covered by a solder resist serving as a protective film, except for the connection terminals 3, 4. The first connection terminals 3 on the first printed circuit board 1 and the second connection terminals 4 on the second printed circuit board 2 are opposite to each other to be overlapped with each other. The opposite first and second connection terminals 3, 4 are connected using the conductive material 5 such as a solder. As the solder, tin-zinc eutectic solder, or an ordinarily employed solder such as tin-silver or tin-antimony can be used.

In this embodiment of the present invention, the above-described connection terminals 3, 4 are formed to be arranged in the first and second circuit boards 1, 2, so that arrangement pitches 6, 7 of the connection terminals 3, 4 arranged from the center portion toward the end portion of the circuit board 1, 2 are made substantially smaller at the endmost portion and/or in the vicinity of the endmost portion. Here, the arrangement pitch 6, 7 refers to the distance between center positions of two adjacent connection terminals 3, 4 in the arrangement direction in each of the circuit boards 1, 2.

In this embodiment, the connection terminals in the vicinity of the endmost portion include at least one connection terminal adjacent to the endmost connection terminal. Preferably, the vicinity of the endmost includes plural connection terminals from the one adjacent to the endmost connection terminal. That is, the connection terminals in the vicinity of the endmost portion preferably include plural connection terminals from the one adjacent to the endmost connection terminal. The arrangement pitch 7 of the connection terminals 3, 4 at the endmost portion and/or in the vicinity of the endmost portion is suitably set at about 0.3 to 0.9, relative to the arrangement pitch 6 of the other connection terminals 3, 4. That is, a ratio of the arrangement pitch 7 to the arrangement pitch 6 is approximately in a range of 0.3–0.9. In this embodiment, the arrangement pitch 7 can be made different in the connection terminals 3, 4 in the vicinity of the endmost portion, and the arrangement pitch 7 can be set to be gradually smaller from the vicinity of the endmost portion toward the endmost portion in each circuit board 1, 2.

When the insulating substrates of both the circuit boards 1, 2 are formed by different insulating materials having different thermal expansion coefficients, an expansion/contraction amount in a heat/cool cycle is different in both the circuit boards 1, 2. Therefore, stress (heat strain) corresponding to a difference between the expansion/contraction amounts of both the circuit boards 1, 2 in spaces between adjacent connection terminals in each board 1, 2 is applied to a connection portion between the connection terminals 3, 4. The heat strain becomes largest at the endmost portion (the connection terminal most apart from the center part) in the arrangement direction of the connection terminals 3, 4. The expansion/contraction amount of the circuit boards 1, 2 is increased as toward the endmost portion from the center in the arrangement direction, and only one side stress is applied to the endmost portion due to the expansion/contraction of the circuit boards 1, 2. That is, when each of the circuit boards 1, 2 has both the endmost portions in the arrangement direction of the connection terminals 3, 4, stresses are received from the connection terminals 3, 4 at both the endmost portions in opposite directions. Accordingly, the stresses applied in the opposite directions are counteracted, so that stress accurately applied to the endmost portion becomes smaller.

When the heat strain repetitively causes in the circuit boards 1, 2, the connection terminals 3, 4 at the endmost portion becomes in fatigue, and a rupture may be caused. When the connection portion of the connection terminals 3, 4 at the endmost portion is ruptured, the heat strain of connection terminals 3, 4 adjacent to the connection portion at the endmost portion becomes larger, and the connection terminals 3, 4 are ruptured in order from the outside of the circuit board 1, 2.

According to the finding of the present inventors, the arrangement pitch of the connection terminals 3, 4 and heat strain have a predetermined relationship. That is, the smaller the arrangement pitch is, the smaller the heat strain is. Accordingly, in this embodiment, the arrangement pitch 7 of the connection terminals 3, 4 positioned at the endmost portion or/and in the vicinity of the endmost portion is set smaller than that positioned at a center area portion in the arrangement direction. Thereby, the heat strain applied to the connection terminals 3, 4 at the endmost portion or/and in the vicinity of the endmost portion can be reduced. As a result, it possible to improve the fatigue life of the connection terminals 3, 4.

Because the heat strain of the connection terminal 3, 4 placed at the endmost portion becomes largest, it is preferable to set the arrangement pitch between the connection terminal 3, 4 at the endmost portion and the adjacent connection terminal 3, 4 adjacent to the endmost connection terminal 3, 4 at a small pitch smaller than a predetermined pitch (e.g., smaller than pitch 7). However, by suitably setting the arrangement pitch between the connection terminals 3, 4 in the vicinity of the endmost portion at a small pitch, the rupture due to the heat strain can be effectively prevented.

In this embodiment of the present invention, as shown in the FIGURE, the first and second connection terminals 3, 4 made of copper are formed on the flexible printed circuit board 1 using polyimide as the insulating material and the rigid printed circuit board 2 using alumina ceramic substrate, respectively. Both the first and second connection terminals 3, 4 of the circuit boards 1, 2 are overlapped with each other, and are connected to each other by the solder 5. In this connection structure of both the circuit boards 1, 2, each of the arrangement pitches 6 of the connection terminals 3, 4 in a predetermined range from the center portion of the circuit board 1, 2 is set approximately to 0.8 mm, and each of the arrangement pitches 7 of four connection terminals 3, 4 from the endmost connection terminal is set approximately to 0.3 mm.

As illustrated in the figure, because the arrangement pitch 7 is narrowed at the endmost portion and in the vicinity of the endmost portion, each cross-sectional area of the connection terminals 3, 4 to be connected to each other becomes smaller than that in the center area portion. Since the cross-sectional areas of the connection terminals 3, 4 at the endmost portion or/and in the vicinity of the endmost portion are set smaller as described above, these connection terminals 3, 4 having the small arrangement pitch 7 can be used not for permitting electric conduction between both the circuit boards 1,2 but as dummy connection terminals for only connection of both the circuit boards 1,2.

According to this embodiment, in a connection method for connecting both the circuit boards 1, 2, the connection terminals 3, 4 are disposed so that the arrangement pitch 7 between connection terminals 3, 4 is set smaller at the endmost portion and/or in the vicinity of the endmost portion. Accordingly, it possible to reduce heat strain of the connection terminals 3, 4, thereby improving their fatigue life.

Although the present invention has been fully described in connection with the preferred embodiment thereof with reference to the accompanying drawing, it is to be noted that various changes and modifications will become apparent to those skilled in the art. Such changes and modifications are to be understood as being within the scope of the present invention as defined by the appended claims.

What is claimed is:

1. A connection structure for both first and second circuit boards, comprising:
    a plurality of first connection terminals arranged on the first circuit board in an arrangement direction;
    a plurality of second connection terminals arranged on the second circuit board in the arrangement direction, wherein the plurality of first connection terminals and the plurality of second connection terminals are respectively opposite each other to form respective opposite pairs;
    an electrical conductive material disposed between the first and second connection terminals,
    wherein: the first circuit board is made of an insulation material different from that of the second circuit board;
    the first and second circuit boards are disposed to be connected to each other by connecting the respective opposite pairs using the electrical conductive material; and
    the first and second connection terminals are arranged to have a first arrangement pitch in a predetermined range from a center in the arrangement direction; and to have a second arrangement pitch at an endmost portion or/and in a vicinity of the endmost portion, the second arrangement pitch being smaller than the first arrangement pitch.

2. The connection structure according to claim 1, wherein each of the first and second circuit boards is a printed circuit board.

3. The connection structure according to claim 1, wherein the first circuit board is a flexible printed board and the second circuit board is a rigid printed circuit board.

4. The connection structure according to claim 1, wherein the electrical conductive material is a solder.

5. The connection structure according to claim 1, wherein a ratio of the second arrangement pitch to the first arrangement pitch is approximately in a range of 0.3–0.9.

6. The connection structure according to claim 1, wherein, in each circuit board, the connection terminals having the second arrangement pitch in the vicinity of the endmost portion include at least one connection terminal adjacent to an endmost connection terminal.

7. The connection structure according to claim 1, wherein each of the first and second connection terminals having the second arrangement pitch has a small sectional area, which is smaller than a sectional area of the first and second connection terminals having the first arrangement pitch.

8. The connection structure according to claim 7, wherein a set of the first and second connection terminals having the small sectional area are used only for physically connecting the first and second circuit boards.

9. The connection structure according to claim 1, wherein the second arrangement pitch is set in the first and second connection terminals to be gradually reduces toward the endmost portion.

10. The connection structure according to claim 1, wherein:
    each of the connection terminals of the plurality of first connection terminals is aligned with one of the connection terminals of the plurality of second connection terminals to form the respective opposite pairs.

11. The connection structure according to claim 1, wherein the first and second connection terminals arranged with the second arrangement pitch are positioned at two sides of the first and second connection terminals arranged with the first arrangement pitch.

12. The connection structure of claim 1, wherein:
    a space exists between every two adjacent terminals of the first connection terminals in the arrangement direction; and
    a space exists between every two adjacent terminals of the second connection terminals in the arrangement direction.

13. The connection structure according to claim 1, wherein:
    at least two respective opposite pairs of the plurality of first and second connection terminals are arranged in the arrangement direction with the first arrangement pitch; and
    at least two respective opposite pairs of the plurality of first and second connection terminals are arranged in the arrangement direction with the second arrangement pitch.

14. A connection method for connecting first and second circuit boards, comprising:
    forming a plurality of first connection terminals arranged on the first circuit board in an arrangement direction;
    forming a plurality of second connection terminals arranged on the second circuit board in the arrangement direction, the first circuit board comprising an insulation material different from that of the second circuit board;
    disposing the plurality of first connection terminals and the plurality of second connection terminals opposite to each other, the plurality of first connection terminals and the plurality of second connection terminals are respectively opposite each other to form respective opposite pairs; and
    connecting the respective opposite pairs using an electrical conductive material;
    wherein, the first and second connection terminals are arranged to have a first arrangement pitch in a predetermined range from a center in the arrangement direction, and to have a second arrangement pitch at an endmost portion or in a vicinity of the endmost portion, the second arrangement pitch being smaller than the first arrangement pitch.

15. The connection method according to claim 14, wherein each of the first and second circuit boards is a printed circuit board.

16. The connection method according to claim 14, wherein the first circuit board is a flexible printed board, and the second circuit board is a rigid printed circuit board.

17. The connection method according to claim 14, wherein the electrical conductive material is a solder.

18. The connection method according to claim 14, wherein a ratio of the second arrangement pitch to the first arrangement pitch is approximately in a range of 0.3–0.9.

19. The connection method according to claim 14, wherein, in each circuit board, the connection terminals having the second arrangement pitch in the vicinity of the endmost portion include at least one connection terminal adjacent to an endmost connection terminal.

20. The connection method according to claim 14, wherein each of the first and second connection terminals having the second arrangement pitch has a small sectional area, which is smaller than a sectional area of the first and second connection terminals having the first arrangement pitch.

21. The connection method according to claim 20, wherein a set of the first and second connection terminals having the small sectional area are used only for physically connecting the first and second circuit boards.

22. The connection method according to claim 14, wherein the second arrangement pitch is set in each of the first and second connection terminals to be gradually reduced toward the endmost portion.

23. The connection method of claim 14, wherein the method includes aligning each of the connection terminals of the plurality of first connection terminals with one of the connections terminals of the plurality of second connection terminals.

24. The connection method of claim 14, wherein the method includes locating the terminals that have the second arrangement pitch at opposite sides of the terminals that have the first arrangement pitch.

25. The connection method of claim 14, wherein the method includes:
   forming a space between every two adjacent terminals of the plurality of first connection terminals in the arrangement direction; and
   forming a space between every two adjacent terminals of the plurality of second connection terminals in the arrangement direction.

26. The connection method of claim 14, wherein the method includes:
   arranging at least two of the opposite pairs using the first arrangement pitch; and
   arranging at least two of the opposite pairs using the second arrangement pitch.

* * * * *